United States Patent
Takahashi et al.

(10) Patent No.: US 6,168,002 B1
(45) Date of Patent: *Jan. 2, 2001

(54) CONTROL SYSTEM FOR USE WITH SEMICONDUCTOR DEVICE TRANSPORTING AND HANDLING APPARATUS

(75) Inventors: Hiroyuki Takahashi; Masaaki Ogawa, both of Gyoda (JP)

(73) Assignee: Advantest Corporation, Tokyo (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/934,023

(22) Filed: Sep. 19, 1997

(30) Foreign Application Priority Data

Sep. 20, 1996 (JP) .................................................. 8-249711

(51) Int. Cl.$^7$ ...................................................... B65G 43/00
(52) U.S. Cl. .............. 198/341; 198/341.03; 198/341.05; 198/346.2
(58) Field of Search ........................ 198/341.01, 341.03, 198/341.05, 346.2; 414/223.01, 223.02, 224

(56) References Cited

U.S. PATENT DOCUMENTS

| | | | |
|---|---|---|---|
| 3,094,897 | * 6/1963 | Kaulfuss et al. | 198/341.05 X |
| 4,270,649 | * 6/1981 | Mayer | 198/341.01 X |
| 4,397,386 | * 8/1983 | Kampf | 198/464.4 |
| 4,907,701 | * 3/1990 | Kobayashi et al. | 414/223.01 X |
| 5,190,431 | 3/1993 | Klug et al. | |
| 5,680,936 | * 10/1997 | Beers | 198/346.2 X |
| 6,011,998 | * 1/2000 | Lichti et al. | 700/228 X |

FOREIGN PATENT DOCUMENTS

WO89/00768 A1   1/1989 (WO).

OTHER PUBLICATIONS

Search and Examination Report (Registry of Trade Marks & Patents, Singapore), dated May 7 1999, for Application No. 9703446–6 and Austrian Patent Office Service and Information Sector (TRF), mailed Jun. 18 1999, 6 pages, (Search Report for Application No. 9703446–6 dated May 21, 1999).*

* cited by examiner

Primary Examiner—Kenneth W. Noland
Assistant Examiner—Gene O. Crawford
(74) Attorney, Agent, or Firm—Staas & Halsey LLP

(57) ABSTRACT

In a handler attracting and transporting ICs by the use of a vacuum pick-up head, a control system is provided which provides for removing a jammed IC without the need for opening the door of the constant temperature chamber, if the vacuum pick-up head's failure to grasp an IC should cause jamming. A jam detecting means detects the occurrence of jam to interrupt the operation of the handler, whereupon a motion control means is activated to move the vacuum pick-up head to and stop it at a position distant from the site of jamming whereby the space above the site of jamming is cleared. This allows for removing the jammed IC by using a manipulator rod inserted through a through-hole formed through the outer wall of the constant temperature chamber.

17 Claims, 4 Drawing Sheets

CONTROL SYSTEM FOR USE WITH SEMICONDUCTOR DEVICE TRANSPORTING AND HANDLING APPARATUS

BACKGROUND OF THE INVENTION

1. Field of the Invention

This invention relates to a control system suitable for use with a semiconductor device transporting and handling apparatus (commonly called handler) which is connected to a semiconductor device testing apparatus for testing semiconductor devices. The transporting and handling apparatus is configured to transport semiconductor devices to be tested to a test section, carrying the tested semiconductor devices out of the test section and sorting them out on the basis of the data of the test results.

2. Description of the Related Art

Many of semiconductor device testing apparatus (commonly called IC tester) for measuring the electrical characteristics of semiconductor deices, particularly semiconductor integrated circuits (hereinafter referred to as IC) typical of the semiconductor devices by applying a test signal of a predetermined pattern to the semiconductor devices to be tested (commonly called DUT) have a semiconductor transporting and handling apparatus connected thereto. In the following disclosure this invention will be described by taking ICs typical of semiconductor devices by example for the convenience of explanation.

FIG. 3 illustrates the general construction of one example of the conventional semiconductor device transporting and handling apparatus (hereinafter referred to as handler) called "horizontal transporting system". A plurality of groups 2 of trays each loaded with ICs are disposed on a platform 1 constituting a base along the lower side 1A thereof as viewed in the drawing. Each of the tray groups 2A–2E consists of a number of trays 12 vertically stacked one on another. The leftmost tray group 2A as viewed in the drawing is positioned at a loader section. The trays of the group 2A in the loader section are loaded with ICs to be tested.

X-Y carrier arm means 3A, 3B takes two ICs at a time, in this example, out of the uppermost tray of the stacked tray group 2A at the loader section and transports them onto a transport means such as a rotary type IC transport table (turntable) 4 called "soak stage". Two rows of positioning recesses 5 for defining the positions for receiving the ICs are formed in the IC transport table 4 at equal angular intervals on concentric circles. Each positioning recess 5 is of substantially square shape and is surrounded on four sides by upwardly inclined walls. Each time the IC transport table 4 rotates by one pitch (a feed angle of one positioning recess 5) in a clockwise direction in the illustrated example, the carrier arm means 3A, 3B drops two ICs down into corresponding ones of the two rows of positioning recesses 5. More specifically, the carrier arm 3A, in this example, of the X-Y carrier arm meas 3A, 3B has mounted thereto a carrier head 3C which is adapted to grasp two of ICs being tested in the tray 12, so that the grasped IC being tested are carried out of the tray 12 to the IC transport table 4 by the movements of the X-Y carrier arm means 3A, 3B in X-Y directions.

The reference numeral 6 denotes rotary type arm means called "contact arm" for transferring the ICs conveyed by the IC transport table 4 to a test section 7. Specifically, the contact arm means 6 is adapted to pick up an IC from each of two of the positioning recesses 5 in the IC transport table 4 and transports them to the test section 7. The contact arm means 6 has three arms each having carrier heads attached thereto and performs the operations, by rotation of the three arms, of sequentially transferring the ICs grasped by the carrier heads to the test section 7 and of sequentially transferring the ICs tested in the test section 7 to a rotary type transfer arm means 8 located at an exit from the test section.

It should be noted that the IC transport table 4, the contact arm means 6 and the test section 7 are contained in a constant temperature chamber 9 (commonly called chamber) so that ICs under test may undergo the testing within the chamber 9 while being maintained at a predetermined temperature. The interior of the constant temperature chamber 9 is temperature controlled so as to be maintained at a preset high or low temperature to apply a predetermined temperature stress to ICs to be tested.

Likewise, the transfer arm means 8 on the exit side of the test section has three arms each having carrier heads attached thereto and is configured to transport the tested ICs grasped by the carrier heads out to an unloader section by rotation of the three arms. ICs taken out of the constant temperature chamber 9 are sorted out on the basis of the test result data and stored in corresponding one of the tray groups 2C, 2D and 2E, three in this example, located in the unloader section. By way of example, non-conforming ICs are stored in a tray of the rightmost tray group 2E, conforming ICs are stored in a tray of the tray group 2D at the left side of the tray group 2E, and ICs which have been determined to need a retest are stored in a tray of the tray group 2C at the left side of the tray group 2D. This sorting is performed by carrier arm means 10A, 10B which is controlled on the basis of the test result data. In this example, the carrier arm 10A of the carrier arm means 10A, 10B has mounted thereto carrier heads 10C which are each adapted to grasp one of the tested ICs and transport it to the designated tray.

It is noted that the tray group 2B located at the second position from the leftmost side is an empty tray group located at a buffer section for accommodating trays emptied of ICs in the loader section. When the uppermost tray of any one of the tray stacks 2C, 2D and 2E in the unloader section is filled with ICs, a tray of this empty tray group 2B is conveyed to the top of the corresponding tray stack to be used to store ICs therein.

While in the handler illustrated in FIG. 3 the IC transport table 4 has two rows of positioning recesses 5 spaced at equal angular intervals for defining the positions for receiving the ICs formed therein on concentric circles such that each time the IC transport table 4 rotates by one pitch in a clockwise direction the X-Y carrier arm means 3A, 3B deposits two ICs into corresponding two of the positioning recesses 5, another type of handler is also in practical use in which the IC transport table 4 has only one row of angularly equally spaced apart positioning recesses 5 formed therein on a concentric circle such that the X-Y carrier arm means 3A, 3B takes one IC at a time out of the tray 12 at the loader section and that each time the IC transport table 4 rotates by one pitch the carrier arm means deposits one IC at a time into one of the positioning recesses 5.

Further, another type of the handler of the horizontal transporting system has also been in practical use in which ICs to be tested which have been beforehand loaded on a customer tray (user tray) by a user are transferred and reloaded onto a test tray capable of withstanding high/low temperatures in a loader section. The test tray is then moved from the loader section to the test section within the constant temperature chamber where ICs under test placed on the tray are transferred by X-Y transport means such as X-Y transport arm means or X-Y transport carrier arm means onto one or more sockets of the IC tester through which a test signal of a predetermined pattern is applied to the ICs under test to measure their electrical characteristics. The tested ICs are then transferred from the socket or sockets onto the test tray by the X-Y transport means, followed by being carried on the test tray out of the test section to the unloader section where the tested ICs are sorted out based on the data of the test results and are transferred from the test tray onto the corresponding customer trays for storage.

In the handler shown in FIG. 3, each of the X-Y carrier arm 3A in the loader section, the contact arm means 6, the transfer arm means 8 on the exit side of the test section, and the carrier arm 10A in the unloader section has its own carrier head mounted thereon whereby ICs are grasped to be transported to the intended position. Such carrier head typically comprises a vacuum pick-up head.

In the other types of handlers described above as well, each of the X-Y carrier arm means in the loader section, the X-Y transport means in the test section, the X-Y carrier arm means in the unloader section, and the like has its own carrier head mounted thereon whereby ICs are grasped to be transported to the intended position. Likewise, such carrier head typically comprises a vacuum pick-up head.

As is well known in the art, the vacuum pick-up head has a vacuum port in its IC suction face through which the air is aspirated to attract and grasp an IC by virtue of the aspirating force.

The trouble with such vacuum pick-up head is, however, that it would be unable to attract an IC, especially if the IC should be positioned below a prescribed position or if the IC should have an improper (offset from the horizontal) position. Consequently, an accident can occur that the vacuum pick-up head alone is moved to the next station without attracting and grasping an IC. Such accident as the mechanical means alone moving without transporting an article (an IC in the present case) is commonly known as "jamming".

It has been conventional to equip the vacuum pick-up head with sensing means for detecting whether an IC has been attracted by the pick-up head or not, the arrangement being such that upon the absence of the IC being detected by sensing means, it is interpreted as being indicative of an occurrence of jamming so that the operation of the handler is ceased.

If jamming has occurred outside of the constant temperature chamber 9, the operator can easily take the procedures to eliminate the jamming as he may remove the IC which caused the jamming or alternatively move the IC manually to a position to which it should have been transported, once he has stopped the operation of the handler.

However, if jamming has occurred inside the constant temperature chamber 9, the door of the chamber must be opened before the phenomenon of jamming can be eliminated. Opening of the door of the chamber 9 brings forth a rapid change in the temperature within the chamber 9, and it takes long for the chamber to be restored to its original temperature during which time the testing of ICs must be interrupted, resulting undesirably in greatly reducing the efficiency of testing.

In order to alleviate this inconvenience, it has been heretofore a practice to have a through-hole 11 through a section of the outer wall 9A of the constant temperature chamber 9 as illustrated in FIG. 4 and to detachably secure plug means (not shown) for closing the through-hole 11 in that hole by means of fastening means such as screws so that the plug means may be removed as required. Specifically, should jamming occur in the interior of the constant temperature chamber 9, the operator may remove the plug means to expose the through-hole 11 so that he may insert a manipulator rod 12 to remove the jammed IC, the manipulator rod 12 comprising a vacuum pipe 12A and a vacuum pick-up head 12B connected to the tip of the pipe. Although not shown in the drawings, the pipe 12A is connected with a hose which is in turn connected with a vacuum pump.

However, ICs which can be removed by the conventional method described above are, in the case of the handler of the type illustrated in FIG. 3, those which have been deposited but improperly positioned in the positioning recess 5 of the IC transport table 4 and those which have been inadvertently deposited onto the IC transport table 4, for example, and in the case of the handler of the other type, those which have been loaded but improperly positioned in the IC carrier in the loader section and those which have been connected with the electrical socket in the test section without being correctly positioned.

Nevertheless, there are some ICs which cannot be removed by the aforesaid method utilizing the manipulator rod. Such incidents would occur, in the case of the handler illustrated in FIG. 3, in instances where the contact arm means 6 has failed to pick up an IC from the IC transport table 4 and in instances where any IC which should be picked up in the test section 7 has missed being attracted by the contact arm means 6, and in the case of the handler of the other type, in instances where ICs loaded on the tray or accommodated in the IC carrier of the test tray have missed being picked up and in instances where ICs have missed being attracted from the socket in the test section.

More specifically, as the contact arm means 6 is in the course of picking up ICs from the positioning recess 5 and transferring them to the test section 7 or is in the process of picking up ICs tested in the test section 7 and transferring them to the transfer arm means 8, the contact arm means 6 would cease to move in that position immediately upon detecting the occurrence of jamming, should any IC loaded in the positioning recess 5 or on the test section 7 miss being picked up. As a result, since the vacuum pick-up head of the contact arm means 6 would cease to move with the vacuum pick-up head overlying the IC which it missed attracting, the manipulator rod 12 inserted into the constant temperature chamber 9 would in vain try to remove the IC from the positioning recess 5 or the test section 7.

This is also the case with the handler of the other type in which the manipulator rod 12 inserted into the constant temperature chamber 9 would fail to remove a jammed IC from the test tray or the socket because the contact arm means 6 would cease to move with the vacuum pick-up head blocking the top of the IC which it missed attracting.

In such instance, therefore, the operator would have to open the door of the constant temperature chamber 9 and manually turn the contact arm means 6 to expose the space above the jammed IC to remove it. For the handler of the other type, the same procedures would be required to remove a jammed IC. As discussed above, opening of the door of the constant temperature chamber 9 causes a rapid change in the temperature within the chamber 9 and a considerably long time is required before the chamber is restored to its original temperature, resulting in the disadvantages of substantially prolonging the testing time and hence appreciably reducing the efficiency of testing.

The foregoing disadvantages are not limited to the case where the vacuum pick-up head is used, but are likewise involved in the case where any other type of carrier head for grasping ICs is used.

SUMMARY OF THE INVENTION

It is an object of this invention to provide a control system for use with a semiconductor device transporting and handling apparatus which permits removal of a jammed IC without the need for opening the door of the constant temperature chamber, if the carrier head should miss grasping a semiconductor device such as an IC to cause jamming.

In one aspect of this invention, the foregoing object is accomplished by providing a control system for use with a semiconductor device transporting and handling apparatus configured such that semiconductor devices carried on and transported by transport means into a constant temperature chamber are grasped and transferred from the transport means by carrier head means to a test section in the constant temperature chamber where the semiconductor devices are tested under a preset temperature condition, followed, upon completion of the testing, by the tested semiconductor devices being grasped and transferred by the carrier head means from the test section to a predetermined location, the control system comprising: a jam detecting means adapted to detect any jam which may occur when the tested semiconductor devices are being grasped in the test section by the carrier head means; and a motion control means operative in response to a detection signal from the jam detecting means to move the carrier head means to and stop it at a position distant from the test section.

In a second aspect of this invention, the foregoing object is accomplished by providing a control system for use with a semiconductor device transporting and handling apparatus configured such that semiconductor devices carried on and transported by transport means into a constant temperature chamber are grasped and transferred from the transport means by carrier head means to a test section in the constant temperature chamber where the semiconductor devices are tested under a preset temperature condition, followed, upon completion of the testing, by the tested semiconductor devices being grasped and transferred by the carrier head means from the test section to a predetermined location, the control system comprising: a jam detecting means adapted to detect any jam which may occur when the semiconductor devices to be tested are being grasped from the transport means by the carrier head means; and a motion control means operative in response to a detection signal from the jam detecting means to move the carrier head means to and stop it at a position distant from the test section.

In a preferred modified embodiment, the jam detecting means are adapted to detect both any jam which may occur when the tested semiconductor devices are being grasped in the test section by the carrier head means and any jam which may occur when the semiconductor devices to be tested are being grasped from the transport means by the carrier head means.

Preferably, the control system further includes a reset means operative in response to a reset signal input thereto to return the carrier head means to its normal position.

In a preferred modified embodiment, the transport means comprises a rotary type transport means having formed therein a plurality of positioning recesses for receiving semiconductor devices at equal angular intervals on a concentric circle, and the carrier head means is mounted on a rotary type arm means such that semiconductor devices to be tested and the tested semiconductor devices are transported from the transport means to the test section and from the test section to a location near an outlet from the constant temperature chamber, respectively by the carrier head means mounted on the rotary type arm means.

In another preferred modified embodiment, the transport means comprises a tray having a plurality of pockets for accommodating semiconductor devices, and the carrier head means is mounted on an X-Y carrier means such that semiconductor devices to be tested and the tested semiconductor devices are transported from the tray to the test section and from the test section to another the tray, respectively by the carrier head means mounted on the X-Y carrier means.

The semiconductor devices may be semiconductor integrated circuits, and the carrier head means may comprise a vacuum pick-up head for vacuum attracting semiconductor integrated circuits (specifically, packages accommodating semiconductor integrated circuits) for transport.

In a third aspect of this invention, the foregoing object i accomplished by providing a control system for use with a semiconductor device transporting and handling apparatus configured such that semiconductor devices carried on and transported by transport means into a constant temperature chamber are attracted and transferred from the transport means by vacuum pick-up head means to a test section in the constant temperature chamber where the semiconductor devices are tested under a preset temperature condition, followed, upon completion of the testing, by the tested semiconductor devices being attracted and transported by the vacuum pick-up head means from the test section to a predetermined location in the constant temperature chamber, the control system comprising: a jam detecting means adapted to detect either any jam which may occur when the semiconductor devices to be tested are being attracted from the transport means by the vacuum pick-up head means or any jam which may occur when the tested semiconductor devices are being attracted in the test section by the vacuum pick-up head means; a motion control means operative in response to a detection signal from the jam detecting means to move the vacuum pick-up head means held at a standstill at a site of occurrence of the jam to and stop it at a position distant from the site of occurrence of the jam; and a reset means operative in response to a reset signal to return the vacuum pick-up head means to its normal position.

In a preferred modified embodiment, the transport means comprises a rotary type transport means having formed therein a plurality of positioning recesses for receiving semiconductor devices at equal angular intervals on a concentric circle, and the vacuum pick-up head means is mounted on a rotary type arm means such that semiconductor devices to be tested and the tested semiconductor devices are transported from the transport means to the test section and from the test section to a location near an outlet from the constant temperature chamber, respectively by the vacuum pick-up head means mounted on the rotary type arm means.

In another preferred modified embodiment, the transport means comprises a tray having a plurality of pockets for accommodating semiconductor devices, and the vacuum pick-up head means is mounted on an X-Y carrier means such that semiconductor devices to be tested and the tested semiconductor devices are transported from the tray to the test section and from the test section to another the tray, respectively by the vacuum pick-up head means mounted on the X-Y carrier means.

According to the construction of this invention, if failure to grasp a semiconductor device by the carrier head should cause jamming, the carrier head is caused to momentarily stop at the position where the jamming occurred, followed by being moved to and halted at a position away from the site of jamming whereby the overhead space above the site of jamming is cleared. This allows for removing the jammed semiconductor device through the through-hole from the exterior of the constant temperature chamber without the need for opening the door of the chamber by the use of a semiconductor device removal tool means such as the manipulator rod described above.

DETAILED DESCRIPTION OF THE PREFERRED EMBODIMENTS

An embodiment of this invention will be described in details with reference to accompanying drawings.

Figure 1:
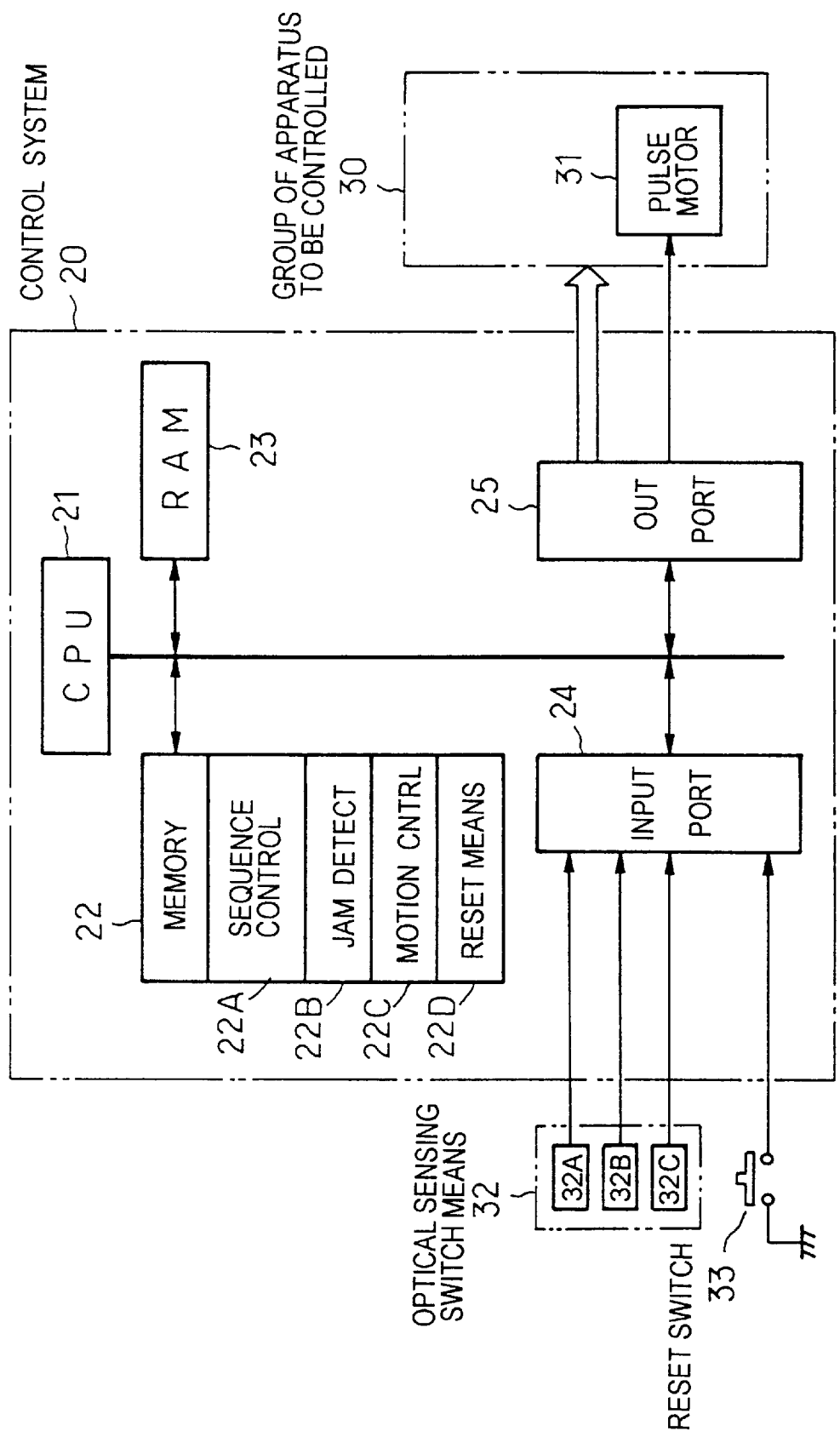
FIG. 1 is a block diagram illustrating one embodiment of the control system according to this invention for a semiconductor device transporting and handling apparatus.

FIG. 1 is a block diagram illustrating one embodiment of the control system according to this invention for a semiconductor device transporting and handling apparatus (handler). This is an example in which this invention is applied to the handler of the type shown in FIG. 3.

In the embodiment illustrated, the control system 20 may comprise a microcomputer, for example. As is well known in the art, the microcomputer comprises a central processing unit (CPU) 21, a memory 22 storing a program for operating the central processing unit (CPU) 21 in a predetermined sequence, a writable and readable random-access memory (hereinafter referred to as RAM) 23 for temporarily storing data input from the exterior, an input port 24 into which output signals from optical sensing switch means 32 and a reset switch 33 are input, and an output port 25 for outputting control signals from the control system 20 to a group of pieces of equipment 30 to be controlled by the control system.

Figure 3:
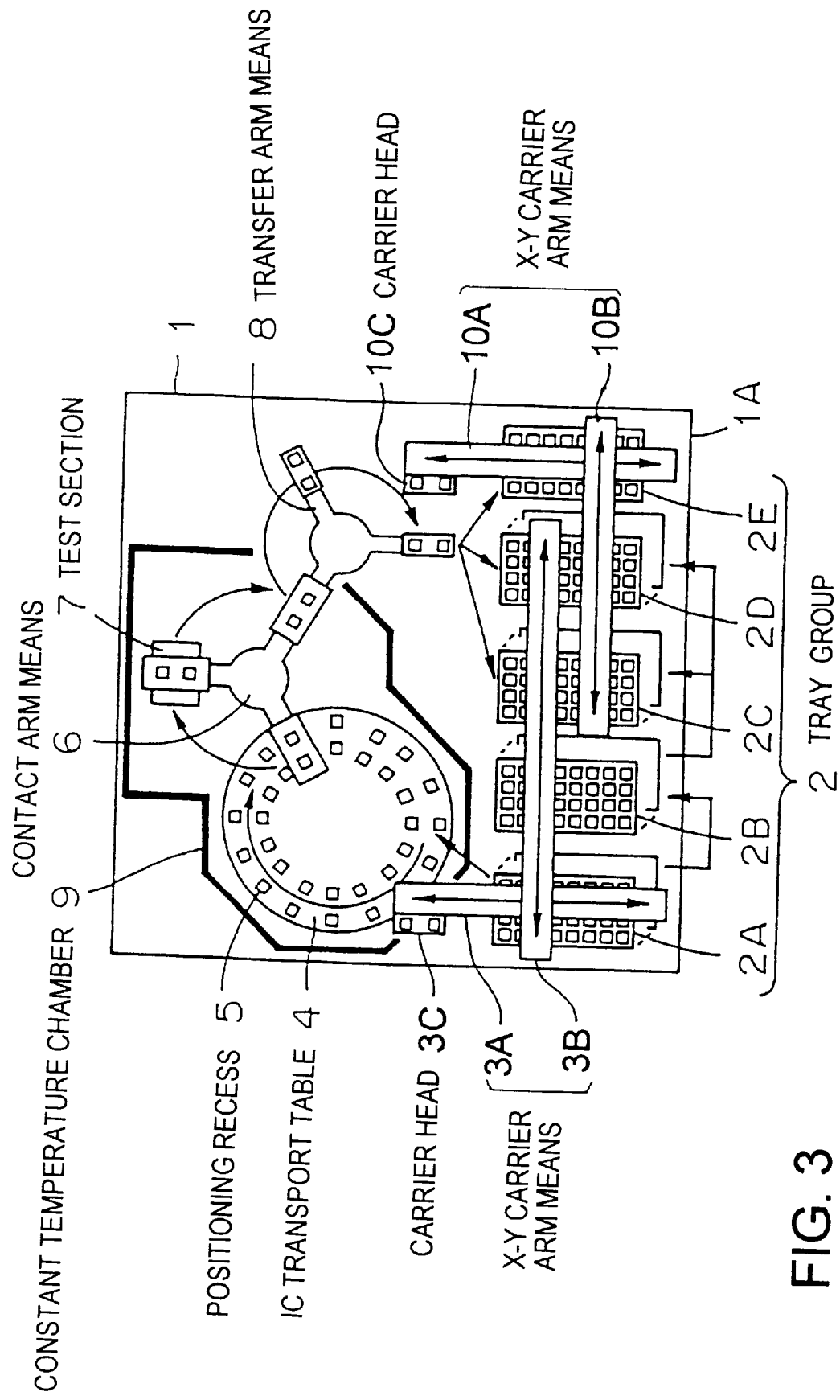
FIG. 3 is a schematic plan view illustrating an example of the semiconductor device transporting and handling apparatus to which this invention may be suitably applied.

The control system further comprises a sequence control means 22A constituted by programs which when activated, is operative to operate the various components of the handler shown in FIG. 3 so as to transport ICs to carry out the testing. The sequence control means 22A is also operative to control the group of pieces of equipment 30 such as pulse motors, air cylinders and others. The pulse motor for driving the contact arm means 6 among the group of pieces of equipment 30 is specifically designated by the reference numeral 31.

While in the embodiment illustrated the sequence control means 22A is prestored in the memory 22, it may be provided separately from the memory 22. It is also apparent to those skilled in the art that the sequence control means 22A may comprise a hardware.

Besides the sequence control means 22A, there is provided a jam detecting means 22B which is adapted to detect the occurrence of a jam on the basis of detection signals from the optical sensing switch means 32 mounted on each of the vacuum pick-up heads, for example and the controlling conditions of the sequence control means 22A.

In this embodiment, the invention will be described with respect to the case where jam detection is effected on the contact arm means 6. In the handler of the type shown in FIG. 3, since each of three arms of the contact arm means 6 is equipped with a set of two vacuum pick-up heads, six vacuum pick-up heads in total are mounted on the contact arm means 6. Three optical sensing switches 32A, 32B and 32C are associated with the three sets of vacuum pick-up heads, respectively, and are operative to output a detection signal of logical "1", for example if an IC has been attracted against the associated vacuum pick-up head and a detection signal of logical "0" if no IC has been attracted against the pick-up head.

In the situations where the vacuum pick-up head of a first arm of the contact arm means 6 ought to pick up an IC from the positioning recess 5 in the IC transport table and transport it to the test section 7 and where the vacuum pick-up head of a second arm of the contact arm means 6 ought to pick up a tested IC from the test section 7 and transfer it to the transfer arm means 8, if the detection signals from the optical sensing switches 32A and 32B, for example are of logical "1" at the point of time when the vacuum pick-up heads has entered into their upward movements with the respective ICs attracted thereagainst, it is indicative of the condition in which the ICs have been successfully picked up, so that the contact arm means as such begins rotating to transport the ICs to the test section 7 and the transfer arm means 8, respectively.

In contrast, if either one or both of the detection signals from the optical sensing switches 32A and 32B, for example are of logical "0" at the point when the cycle has entered into the sequence of moving the vacuum pick-up heads upwardly, it is indicative of the condition in which at least one of the vacuum pick-up heads has missed attracting the IC, so that the jam detecting means 22B detects the occurrence of a jam and provides a jam detection signal to the sequence control means 22A which in turn stops the operation of the entire handler.

This embodiment is characterized by the provision of a motion control means 22C which is activated following the occurrence of a jam to move the contact arm means 6 by a predetermined distance. More specifically, the motion control means 22C is activated, after the jam detecting means 22B has detected the occurrence of a jam whereby the sequence control means 22A has terminated the operation of the entire handler, to effect the control to move the contact arm means 6 by a predetermined distance away from the site of occurrence of the jam.

Figure 2:
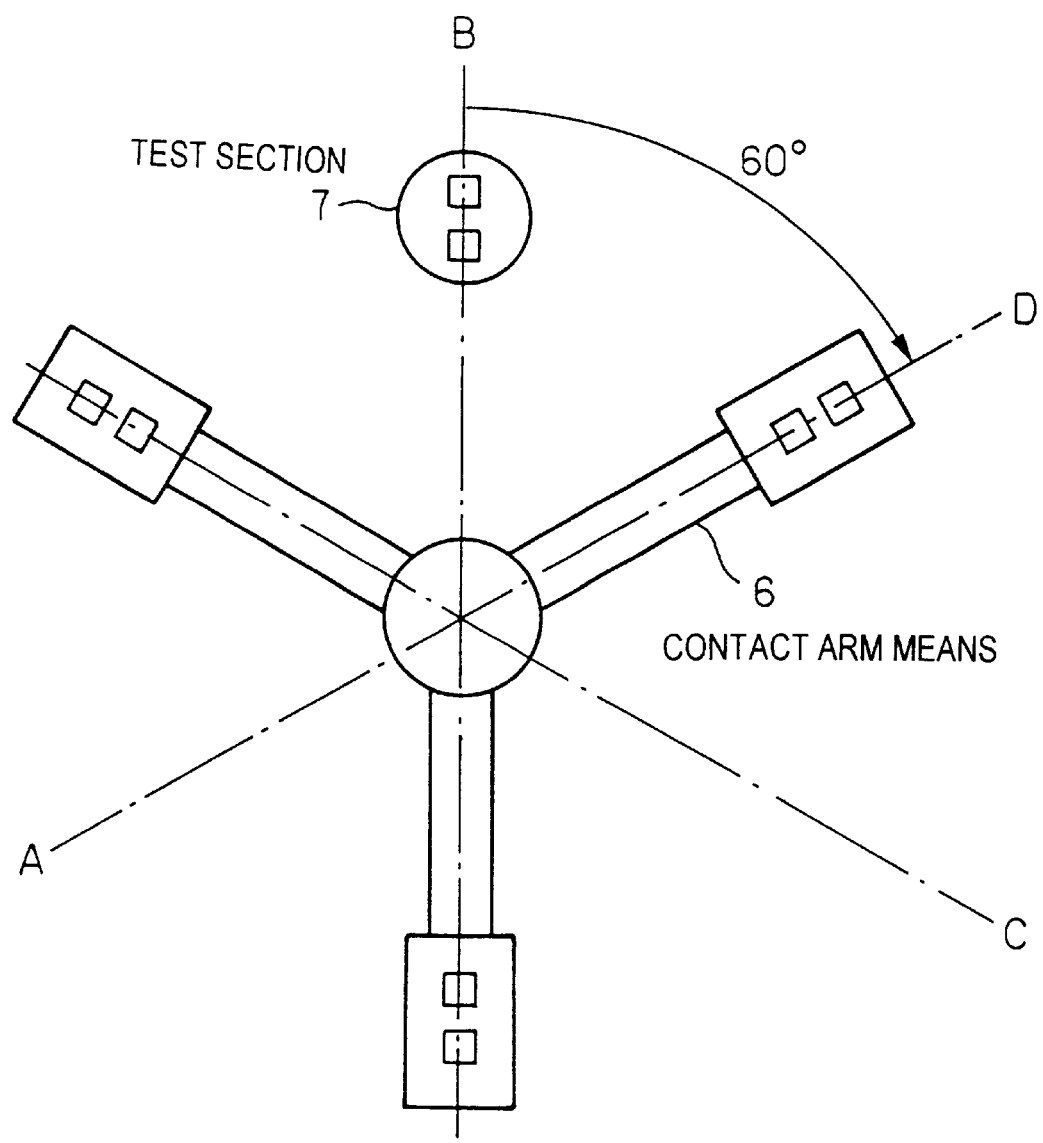
FIG. 2 is a plan view illustrating how the contact arm means is operated where this invention is applied to the semiconductor device transporting and handling apparatus shown in FIG. 3.

The motion control means 22C, when activated, provides a predetermined number of drive pulses through the central processing unit 21 and the output port 25 to the pulse motor 31 for driving the contact arm means 6 of the group of pieces of equipment 30 to be controlled. While the number of drive pulses is selected so as to rotate or index the arms of the contact arm means 6 by approximately 60° in this embodiment as shown in FIG. 2, it is to be understood that any appropriate number of drive pulses may be used sufficient to move the arms of the contact arm means 6 to a position in which the space above the jammed IC is opened. The pulse motor 31 is activated under the control of the motion control means 22C to rotate the contact arm means 6 by approximately 60° as shown in FIG. 2, whereupon the motion control means 22C stops producing the drive pulses to temporarily stop the contact arm means 6 with its arms at a standstill at a position intermediate the angle of one rotation (index) (the temporary stop position of one arm is shown at D in FIG. 2). In this position, the arms of the contact arm means 6 are removed away from the space above the positioning recess 5 (in which the IC has been left over without being successfully picked up) in the IC transport table 4 and the overhead space above the test section 7.

It is to be appreciated that this allows the operator to remove the IC or ICs left over in the positioning recess 5 and/or the test section 7 by opening the through-hole 11 in the outer wall of the constant temperature chamber 9 and inserting the manipulator rod 12 though the through-hole 11.

Once the jammed IC or ICs have been removed and the through-hole 11 formed through the outer wall of the constant temperature chamber 9 has been closed, the operator turns on the reset switch 33 to input a reset signal through the input port 24 to the control system 20.

Upon the reset signal being input, reset means 22D is activated to resume the operation of the control system 20 whereby the latter is brought back to the condition under the control of the sequence control means 22A. The contact arm means 6 is thus restored to its normal position with its arms positioned at their normal positions A, B and C as shown in FIG. 2, and hence to its normal operational condition.

It is to be noted that like the sequence control means 22A, the jam detecting means 22B, the motion control means 22C and the reset means 22D are constituted by programs and prestored in the memory 22 in the illustrated embodiment. However, it is needless to say that they may be provided separately from the memory 22 or alternatively may be constituted by hardwares.

Figure 4:
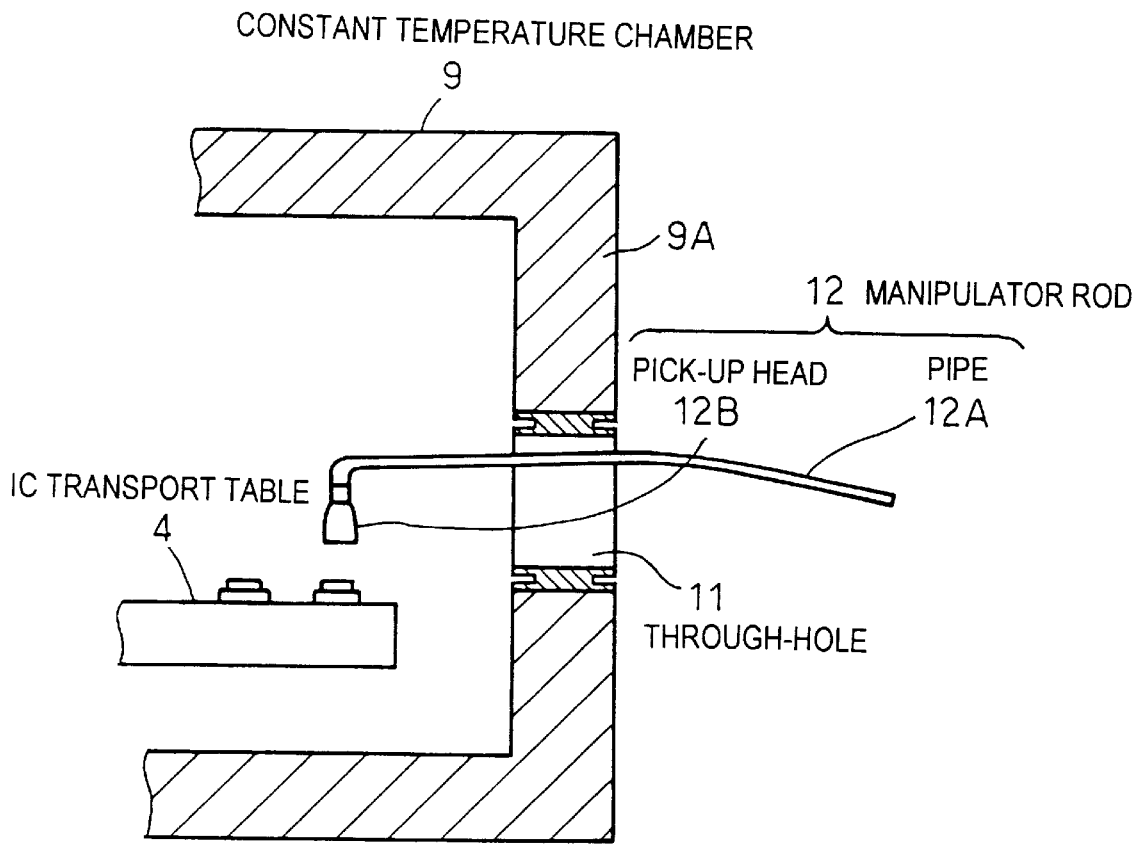
FIG. 4 is a schematic side view, partly in cross-section, of a portion of the semiconductor device transporting and handling apparatus shown in FIG. 3, illustrating how a jammed IC may be removed from the exterior of the constant temperature chamber.

As discussed above, according to this invention, if jamming should occur in the handler, the operation of the handler would be interrupted temporarily for a time during which the motion control means 22C is activated to move the contact arm means 6 by a predetermined distance to thereby expose the space above the site of jamming. This permits the jammed IC to be removed by an IC removal tool means such as the manipulator rod 12 as illustrated in FIG. 4 without the need for opening the door of the constant temperature chamber 9, even if the jamming has occurred due to failure of the vacuum pick-up head to attract the IC. As a result, it is possible to eliminate jamming without causing a great change in the temperature within the constant temperature chamber 9, so that the temperature in the constant temperature chamber may be restored to its original temperature in a short time, should jamming occur. Thus, the temperature in the constant temperature chamber 9 may be restored in a short time to the temperature conditions appropriate for the testing whereby the invention provides the remarkable advantage of permitting the testing to be effected efficiently.

While in the illustrated embodiment this invention has been described above as being applied to the handler of the type as shown in FIG. 3 in which ICs are transported into the test section 7 by the contact arm means 6, it will be easily appreciated that this invention is not limited to this type of handler, but equally applicable, with the same advantages, to the handler of the type in which ICs are transported into the test section 7 by vacuum pick-up head means movable in X-Y directions, or to the handler of the type in which ICs are transferred from a universal use tray onto a test tray which is, with the ICs carried thereon, moved to the test section 7 where the ICs as loaded on the test tray are subjected to testing.

Further, while in the illustrated embodiment this invention is applied to the handler for transporting and handling ICs, it is obvious that this invention is also applicable, with the same advantages, to the handler for transporting and handling semiconductor devices other than ICs. Moreover, it will be apparent to those skilled in the art that the invention is not limited to the handler of the type in which ICs are grasped and transported by vacuum pick-up head means, but also applicable to the handler of the type in which ICs are grasped and transported by carrier head means other than vacuum pick-up head means.

What is claimed is:

1. A semiconductor device transporting and handling apparatus for use with a constant temperature chamber having a test section, said semiconductor device transporting and handling apparatus comprising:

transport means for transporting semiconductor devices;

carrier head means having a pick and place head picking up and placing down the semiconductor devices for transporting the semiconductor devices from a pick up location to a place down location; and a control system controlling operation of the semiconductor device transporting and handling apparatus; wherein semiconductor devices to be tested are transported by said transport means into a constant temperature chamber where said semiconductor devices are picked up by the pick and place head and transferred from said transport means by said carrier head means onto said test section in said constant temperature chamber which applies a predetermined test to the semiconductor devices, and upon completion of the test, the tested semiconductor devices are picked up by the pick and place head and transferred by said carrier head means from said test section to a predetermined location, said control system comprising:

jam detecting means for issuing a detection signal upon detecting any jam which occurs when the tested semiconductor devices fail to be picked up from said test section by said pick and place head of said carrier head means; and motion control means operative in response to the detection signal from said jam detecting means for temporally moving said carrier head means so as to cause said pick and place head to position at a position distant from said pick up location on said test section.

2. A semiconductor device transporting and handling apparatus for use with a constant temperature chamber having a test section, said semiconductor device transporting and handling apparatus comprising:

transport means for transporting semiconductor devices;

carrier head means having a pick and place head picking up and placing down the semiconductor devices for transporting the semiconductor devices from a pick up location to a place down location; and a control system controlling operation of the semiconductor device transporting and handling apparatus; wherein semiconductor devices to be tested are transported by said transport means into a constant temperature chamber where said semiconductor devices are picked up by the pick and place head and transferred from said transport means by said carrier head means onto said test section in said constant temperature chamber which applies a predetermined test to the semiconductor devices, and upon completion of the test, the tested semiconductor devices are picked up by the pick and place head and transferred by said carrier head means from said test section to a predetermined location, said control system comprising:

jam detecting means for issuing a detection signal upon detecting any jam which occurs when the semiconductor devices to be tested fail to be picked up from said transport means by said pick and place head of said carrier head means; and motion control means operative in response to the detection signal from said jam detecting means for temporally moving said carrier head means so as to cause said pick and place head to position at a position distant from said pick up location on said transport means.

3. A semiconductor device transporting and handling apparatus for use with a constant temperature chamber having a test section, said semiconductor device transporting and handling apparatus comprising:

transport means for transporting semiconductor devices;

carrier head means having a pick and place head picking up and placing down the semiconductor devices for transporting the semiconductor devices from a pick up location to a place down location; and a control system controlling operation of the semiconductor device transporting and handling apparatus; wherein semiconductor devices to be tested are transported by said transport means into a constant temperature chamber where said semiconductor devices are picked up by the pick and place head and transferred from said transport means by said carrier head means onto said test section in said constant temperature chamber which applies a predetermined test to the semiconductor devices, and upon completion of the test, the tested semiconductor devices are picked up by the pick and place head and transferred by said carrier head means from said test section to a predetermined location, said control system comprising:

jam detecting means for issuing a detection signal upon detecting either any jam which occurs when the semiconductor devices to be tested fail to be picked up from said transport means by said pick and place head of said carrier head means or any jam which occurs when the tested semiconductor devices are failed to be picked up from said test section by said pick and place head of said carrier head means; and motion control means operative in response to the detection signal from said jam detecting means for temporally moving said carrier head means so as to cause said pick and place head to position at a position distant from said pick up location either on said transport means or said test section.

4. The semiconductor device transporting and handling apparatus according to claim 1, wherein said control system further comprises reset means operative in response to a reset signal input thereto to return said carrier head means to its normal position.

5. The semiconductor device transporting and handling apparatus according to claim 2, wherein said control system further comprises reset means operative in response to a reset signal input thereto to return said carrier head means to its normal position.

6. The semiconductor device transporting and handling apparatus according to claim 3, wherein said control system further comprises reset means operative in response to a reset signal input thereto to return said carrier head means to its normal position.

7. The semiconductor device transporting and handling apparatus according to any one of claims 1 to 6, wherein said transport means comprises a rotary type transport table having therein a plurality of positioning recesses receiving semiconductor devices formed at equal angular intervals in at least a concentric circle, said carrier head means comprises rotary type arm means having at least three arms each having the pick and place head, and said predetermined location to which the tested semiconductor devices are transported is a location near an outlet of said constant temperature chamber.

8. The semiconductor device transporting and handling apparatus according to any one of claims 1 to 6, wherein said transport means comprises a tray having a plurality of pockets for accommodating semiconductor devices, said carrier head means comprises X-Y carrier means to which the pick and place head is mounted, and said predetermined location to which the tested semiconductor devices are transferred is said tray.

9. The semiconductor device transporting and handling apparatus according to claim 7, wherein said semiconductor devices are semiconductor integrated circuits (ICs), and said pick and place head of the carrier head means comprises a vacuum suction head for picking up the semiconductor integrated circuits by vacuum suction force.

10. The semiconductor device transporting and handling apparatus according to claim 8, wherein said semiconductor devices are semiconductor integrated circuits (ICs), and said pick and place head of the carrier head means comprises a vacuum suction head for picking up the semiconductor integrated circuits by vacuum suction force.

11. A semiconductor device transporting and handling apparatus for use with a constant temperature chamber having a test section, said semiconductor device transporting and handling apparatus comprising:

transport means loaded thereon with semiconductor devices for transporting the thus loaded semiconductor devices;

carrier head means having a vacuum suction head capable of picking up semiconductor devices at a pick up location and placing down the thus picked up semiconductor devices at a place down location for transporting the vacuum suction head from the pick up location to the place down location; and a control system controlling operation of the semiconductor device transporting and handling apparatus; wherein semiconductor devices to be tested are transported by said transport means into a constant temperature chamber where said semiconductor devices are picked up and transferred by said carrier head means from said transport means to the test section in said constant temperature chamber where the semiconductor devices are tested, and upon completion of the test, the tested semiconductor devices are picked up and transported by said carrier head means from said test section to a predetermined location, said control system comprising:

jam detecting means for issuing a detection signal upon detecting either any jam which occurs when the semiconductor devices to be tested fail to be picked up from said transport means by said vacuum suction head or any jam which occurs when the tested semiconductor devices fail to be picked up from said test section by said vacuum suction head;

motion control means operative in response to the detection signal from said jam detecting means for holding said vacuum suction head at a site of occurrence of the jam and then for temporally moving said carrier head means so as to cause the vacuum suction head to position at a position distant from said site of occurrence of the jam; and reset means operative in response to a reset signal supplied thereto for returning said vacuum suction head to its normal position.

12. The semiconductor device transporting and handling apparatus according to claim 11, wherein said transport means comprises a rotary type transport table having therein a plurality of positioning recesses receiving semiconductor devices which are formed at equal angular intervals in at least a concentric circle, said carrier head means comprises rotary type arm means having at least three arms each having the vacuum suction head, and said predetermined location to which the tested semiconductor devices are transferred is a location near an outlet of said constant temperature chamber.

13. The semiconductor device transporting and handling apparatus according to claim 11, wherein said transport means comprises a tray having a plurality of pockets accommodating semiconductor devices, said carrier head means comprises X-Y carrier means to which the vacuum suction head is mounted, and said predetermined location to which the tested semiconductor devices are transferred is said tray.

14. The semiconductor device transporting and handling apparatus according to any one of claims 11 to 13, wherein said semiconductor devices are semiconductor integrated circuits (ICs).

15. A semiconductor device transporting and handling apparatus for use with a constant temperature chamber having a test section, said semiconductor device transporting and handling apparatus comprising:

transport means loaded thereon with semiconductor devices for transporting the thus loaded semiconductor devices;

carrier head means having a pick and place head which picks up semiconductor devices at a pick up location and places down the thus picked up semiconductor devices at a place down location for carrying said pick and place head from the pick up location to the place down location; and a control system controlling the semiconductor device transporting and handling apparatus; wherein semiconductor devices to be tested are loaded on said transport means, said transport means transports the semiconductor devices thus loaded thereon into the constant temperature chamber where said semiconductor devices are subjected to a preset temperature condition, said pick and place head picks up said semiconductor devices from said transport means and is transported with the thus picked up semiconductor devices above said test section in said constant temperature chamber and places down the semiconductor devices on said test section which applies a predetermined test to the semiconductor devices under the preset temperature condition, and upon completion of the test, said pick and place head picks up the tested semiconductor devices from said test section and is transported with the thus picked up semiconductor devices to a predetermined location, and said control system comprising:

jam detecting means for issuing a detection signal upon detecting any jam which occurs when the tested semiconductor devices fail to be picked up from said test section by said pick and place head of said carrier head means; and motion control means operative in response to the detection signal from said jam detecting means for temporally moving said carrier head means so as to cause said pick and place head to position at a position distant from said pick up location on said test section.

16. A semiconductor device testing apparatus comprising a semiconductor device transporting and handling apparatus and a constant temperature chamber, said constant chamber having a test section which section applies a predetermined test to semiconductor devices, said semiconductor device transporting and handling apparatus comprising:

transport means for transporting semiconductor devices;

carrier head means having a pick and place head for carrying said pick and place head from a pick up location where said pick and place head picks up semiconductor devices and to a place down location where said pick and place head places down the thus picked up semiconductor devices; and a control system for controlling the semiconductor device transporting and handling apparatus upon occurrence of any jam; wherein said transport means loaded thereon with the semiconductor devices transports the thus loaded semiconductor devices into the constant temperature chamber where said semiconductor devices are subjected to a preset temperature condition, said semiconductor devices are picked up by said pick and place head from said transport means in said constant temperature chamber and the thus picked up semiconductor devices are then transported by said carrier head means so as to be placed down onto said test section which applies the predetermined test to the semiconductor devices under the preset temperature condition, and upon completion of the test, said pick and place head picks up the thus tested semiconductor devices from the test section and the thus picked up semiconductor devices are transported by the carrier head means so as to be placed at a predetermined place down location, said control system comprising:

jam detecting means for issuing a detection signal upon detecting any jam which occurs upon failure of picking up of the semiconductor devices by said pick and place head; and motion control means responsive to the detection signal from said jam detecting means for immediately stopping said carrier head means and then for instantaneously moving said carrier head means so as to cause said pick and place head to position at a refuge position which is distant from said pick up location at which the jam occurs whereby said jam is easily removed.

17. A semiconductor device testing apparatus according to claim 16, wherein said transport means comprises a rotary type transport table having a plurality of positioning recesses receiving semiconductor devices and formed in said table at equal angular intervals to form at least one concentric circle therewith, said carrier head means comprises rotary type contact arm means having at least three arms at equal angular intervals from each other, each said arm includes the pick and place head, said carrier head means is intermittently rotated by each said angular interval so that each arm positions at a location above said transport means on one instant, at a location above said testing section on next one instant, and at a location above said predetermined place down location on the next one instant, and said refuge position to which one pick and place head is to be positioned when any jam occurs on the testing section is a mid-position between said angular interval of the arms of said contact arm means.

* * * * *